United States Patent
Katti

(10) Patent No.: US 12,463,146 B2
(45) Date of Patent: Nov. 4, 2025

(54) MAGNETIC SHIELDING FOR MAGNETIC DEVICES

(71) Applicant: Honeywell International Inc., Charlotte, NC (US)

(72) Inventor: Romney R. Katti, Shorewood, MN (US)

(73) Assignee: Honeywell International Inc., Charlotte, NC (US)

( * ) Notice: Subject to any disclaimer, the term of this patent is extended or adjusted under 35 U.S.C. 154(b) by 215 days.

(21) Appl. No.: 17/305,755

(22) Filed: Jul. 14, 2021

(65) Prior Publication Data

US 2023/0014296 A1  Jan. 19, 2023

(51) Int. Cl.
| H10B 61/00 | (2023.01) |
| H01L 23/552 | (2006.01) |
| H10N 50/10 | (2023.01) |
| H01F 41/34 | (2006.01) |

(52) U.S. Cl.
CPC ........... *H01L 23/552* (2013.01); *H10B 61/00* (2023.02); *H10N 50/10* (2023.02); *H01F 41/34* (2013.01)

(58) Field of Classification Search
CPC ...... H01L 23/552; H10B 61/00; H10N 50/10; H01F 10/3254; H01F 41/34; H01F 10/329
USPC ......................................................... 257/659
See application file for complete search history.

(56) References Cited

U.S. PATENT DOCUMENTS

| 7,336,556 | B2 | 2/2008 | Okayama et al. |
| 8,792,208 | B1 | 7/2014 | Liu et al. |
| 9,172,028 | B2 | 10/2015 | Watanabe et al. |
| 9,553,052 | B2 | 1/2017 | Matsubara et al. |
| 10,261,138 | B2 | 4/2019 | Marauska et al. |
| 10,453,801 | B2 | 10/2019 | Seo et al. |
| 10,510,946 | B2 | 12/2019 | Bhushan et al. |
| 2004/0165320 | A1* | 8/2004 | Carey .................... H10N 50/85 365/158 |

(Continued)

FOREIGN PATENT DOCUMENTS

| JP | 2005011860 A | * | 1/2005 |
| KR | 100313988 B1 | | 1/2002 |
| WO | 2016174509 A1 | | 11/2016 |

OTHER PUBLICATIONS

Relevent Section of Asai in English. No Date.*
U.S. Appl. No. 18/295,518, filed Apr. 4, 2023, naming inventors Katti et al.

*Primary Examiner* — Nathan W Ha
(74) *Attorney, Agent, or Firm* — Shumaker & Sieffert, P.A.

(57) ABSTRACT

An example device includes a magnetic device, a first magnetic shielding, and a second magnetic shielding. The magnetic device is configured to determine a perpendicular magnetization that extends along a z-axis. The first magnetic shielding comprises a first magnetic material, the first magnetic shielding extending at least partially between a first surface of the magnetic device and a second surface of the magnetic device in the z-axis. The first surface is on an opposite side of the magnetic device from the second surface of the magnetic device. The second magnetic shielding comprises a second magnetic material, the second magnetic shielding extending at least partially between a third surface of the magnetic device and a fourth surface of the magnetic device in an x-axis. The fourth surface is on an opposite side of the magnetic device from the third surface of the magnetic device.

18 Claims, 13 Drawing Sheets

(56) References Cited

U.S. PATENT DOCUMENTS

| | | | |
|---|---|---|---|
| 2005/0059170 A1* | 3/2005 | Min | H10N 50/01 257/E27.005 |
| 2008/0122047 A1* | 5/2008 | Honer | H01L 23/552 257/659 |
| 2012/0287708 A1* | 11/2012 | Katti | G11C 11/1659 365/171 |
| 2013/0250662 A1* | 9/2013 | Katti | H10B 61/22 365/158 |
| 2015/0069545 A1* | 3/2015 | Noma | H10N 50/80 257/421 |
| 2015/0179192 A1 | 6/2015 | Narayana | |
| 2016/0284761 A1* | 9/2016 | Zhou | H01L 23/552 |
| 2019/0279698 A1 | 9/2019 | Ohmori et al. | |

* cited by examiner

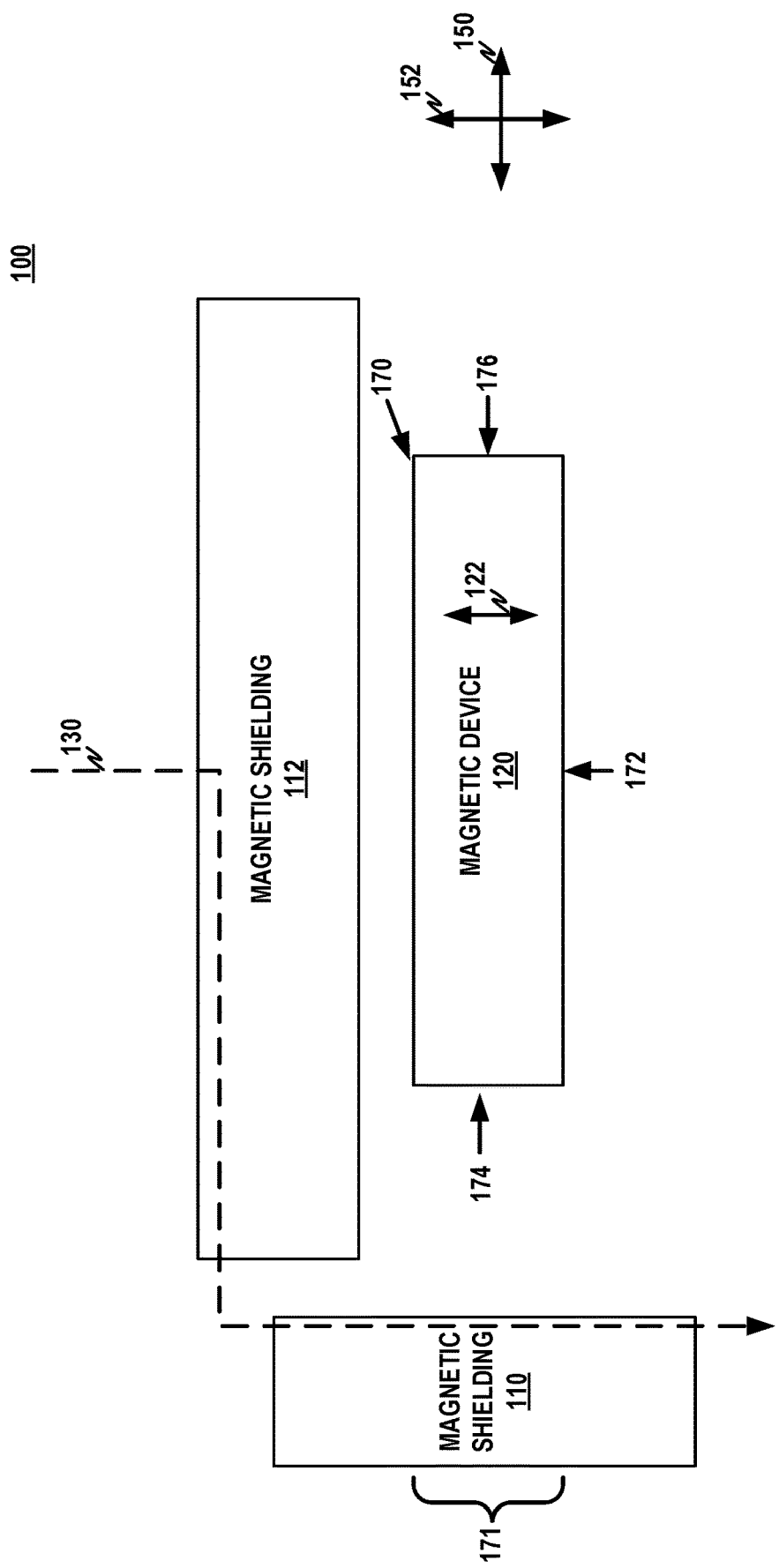

MAGNETIC SHIELDING FOR MAGNETIC DEVICES

STATEMENT REGARDING FEDERALLY SPONSORED RESEARCH OR DEVELOPMENT

This invention was made with government support under FA9453-19-C-0010 awarded by the Air Force Research Laboratory. The government has certain rights in the invention.

TECHNICAL FIELD

This disclosure relates to memory devices and, more specifically, to magnetic devices.

BACKGROUND

Most modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs, etc.) to store data without any moving parts and with faster read and write access.

SUMMARY

This disclosure generally describes techniques for magnetic shielding for perpendicularly oriented magnetic devices (e.g., magnetic devices using a magnetic field that is perpendicular to a plane of a package or chip of the magnetic device). Magnetic devices may include, for example, a memory device comprising a magneto-resistive random access memory (MRAM), such as, for example, magnetic tunnel junction (MTJ) element and/or spin-torque transfer MRAM (STT-MRAM).

Magnetic shielding may protect magnetic devices, such as magnetic memory devices, from external or stray magnetic fields. For example, plates of magnetic material may be placed on a top and a bottom of a single chip package or a multi-chip module to help to prevent the external or stray magnetic fields from altering in-plane magnetization of magnetic devices. As used herein, in-plane magnetization comprise magnetization parallel with a plane formed by the top and bottom magnetic shields. For example, a magnetic memory device may store a bit based on whether a magnetic field is directed in a positive horizontal direction (e.g., x) or a negative horizontal direction (e.g., −x), where the magnetic shielding extends along the horizontal direction (e.g., x) and a depth dimension (e.g., y). Pin connections may extend from the side (e.g., extending along the x direction) of the single chip package or a multi-chip module. In this example, the top of the chip (e.g., maximum z value) is the top magnetic shield and the bottom of the chip (e.g., minimum z value) is the bottom magnetic shield.

Memory devices may be sensitive to perpendicular magnetization (i.e., along a z axis). Such magnetization may not be mitigated by a top magnetic plate and a bottom magnetic plate. As such, techniques described herein may include magnetic shielding to help to prevent external or stray magnetic fields from altering perpendicular magnetization of magnetic devices. For example, a device may include magnetic shielding (e.g., a rectangular plate or a columnar structure) that extends along the z-axis. The magnetic shielding may be oriented to extend more along the z-axis than the x and y axes or may be oriented to extend more along the x-axis than the y and z axes.

In one example, a device includes a magnetic device, a first magnetic shielding, and a second magnetic shielding. The magnetic device is configured to determine a perpendicular magnetization that extends along a z-axis. The first magnetic shielding comprises a first magnetic material, the first magnetic shielding extending at least partially between a first surface of the magnetic device and a second surface of the magnetic device in the z-axis. The first surface is on an opposite side of the magnetic device from the second surface of the magnetic device. The second magnetic shielding comprises a second magnetic material, the second magnetic shielding extending at least partially between a third surface of the magnetic device and a fourth surface of the magnetic device in an x-axis. The fourth surface is on an opposite side of the magnetic device from the third surface of the magnetic device.

In another example, a chip package comprises a magnetic device configured to determine a perpendicular magnetization that extends along a z-axis and a first magnetic shielding comprising a first magnetic material, the first magnetic shielding extending at least partially between a first surface of the magnetic device and a second surface of the magnetic device in the z-axis. The first surface is on an opposite side of the magnetic device from the second surface of the magnetic device. The chip package further comprises second magnetic shielding comprising a second magnetic material, the second magnetic shielding extending at least partially between a third surface of the magnetic device and a fourth surface of the magnetic device in an x-axis. The fourth surface is on an opposite side of the magnetic device from the third surface of the magnetic device. The chip package further comprises one or more pins, each pin of the one or more pins being electrically coupled to the magnetic device and extending from the magnetic device along the x-axis and completely through the first magnetic shielding.

In one example, a device comprises magneto-resistive random access memories (MRAMs), each MRAM being configured to store data based on a perpendicular magnetization that extends along a z-axis and first magnetic shielding comprising a first magnetic material, the first magnetic shielding extending at least partially between a first surface of the magnetic device and a second surface of the magnetic device in the z-axis. The first surface is on an opposite side of the magnetic device from the second surface of the magnetic device. The device further comprises second magnetic shielding comprising a second magnetic material, the second magnetic shielding extending at least partially between a third surface of the magnetic device and a fourth surface of the magnetic device in an x-axis. The fourth surface is on an opposite side of the magnetic device from the third surface of the magnetic device.

The details of one or more aspects of the disclosure are set forth in the accompanying drawings and the description below. Other features, objects, and advantages of the devices, systems, methods, and techniques described in this disclosure will be apparent from the description and drawings, and from the claims.

BRIEF DESCRIPTION OF DRAWINGS

FIG. 1A shows a conceptual illustration of a first example of magnetic shielding of a magnetic device in a two-dimensional x-z plane view, in accordance with the techniques of the disclosure.

DETAILED DESCRIPTION

Figure 1B:
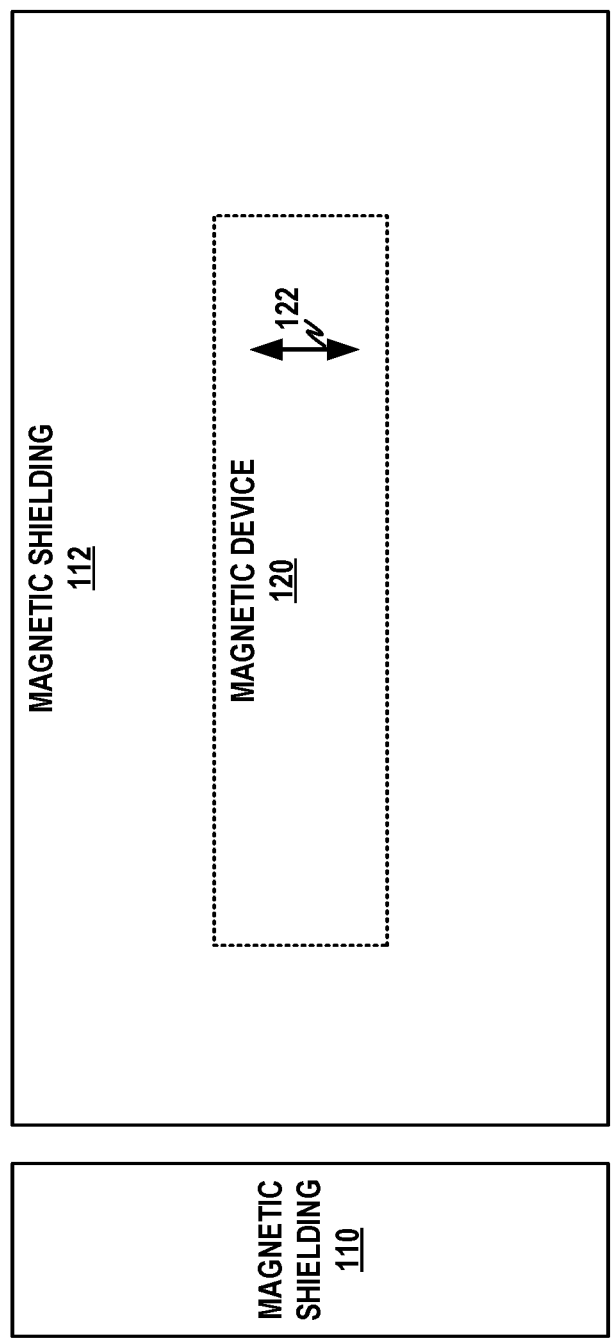
FIG. 1B shows a conceptual illustration of the magnetic shielding of FIG. 1A in a two-dimensional x-y plane view, in accordance with the techniques of the disclosure.

Some applications have been identified in which memory devices, memory components/parts, and architectures may need to be radiation-hardened, offer non-volatility, and/or include magnetically-based devices that can be integrated monolithically or in multi-chip modules. Magneto-Resistive Random Access Memory (MRAM) is robust, has high endurance, has high data retention performance, and is scalable. These characteristics can be tailored for applications. Magnetic/spintronic memory devices are expected to provide desired non-volatile (and volatile) memory and data storage characteristics; including providing scalability, high endurance, and high data retention performance. These characteristics can be optimized for applications. Magnetic/spintronic memory devices may offer materials and technological similarity and compatibility with MRAM bits and other sensing devices such as accelerometers, gyros, and pressure sensors, which may support integration, modularity, miniaturization, and packaging with embedded MRAM and application specific integrated circuits (ASICs).

MRAMs may be used to store and access data with non-volatility for computing and data system applications. Magnetic devices may represent elements within MRAMs that are written, accessed, and used to store information with non-volatility. Incorrect operation of magnetic devices and MRAMs can be induced by external or stray magnetic fields of sufficient magnitude and direction. Magnetic shielding may be used to protect magnetic devices to facilitate and maintain correct MRAM operation. Because MRAMs may be used and anticipated for use in diverse environments that may include stray magnetic fields, MRAMs may benefit from magnetic shielding when handling and deployment of MRAMs may be subject to external or stray magnetic field exposure. In particular, magnetic devices, e.g., Magnetic Tunnel Junctions (MTJs) exhibiting and using perpendicular magnetization and spin-transfer torque (STT) and magneto-resistive effects can be adversely affected by excessive stray magnetic fields, and so magnetic shielding may be used to protect STT-MRAMs in such circumstances. While some techniques for providing magnetic shielding for MRAMs with magnetic devices with in-plane magnetization, magnetic shielding for MRAMs, including STT-MRAMs, with magnetic devices with out-of-plane, or perpendicular, magnetization.

Magnetic shielding may protect magnetic devices that could experience magnetic state changes from external/stray magnetic fields. For example, a magnetic shield may shunt magnetic field(s) from active magnetic layers of a magnetic device. Magnetic shielding for protecting in-plane magnetic devices may not be applicable for magnetically shielding out-of-plane, or perpendicular magnetization in an operational magnetic device layer, for magnetic devices. For example, magnetic shielding for only "in-plane magnetization in an operational magnetic device layer" magnetic devices such as in MRAMs may not protect magnetic devices that operate using out-of-plane magnetization in environments where external or stray magnetic fields could exceed the critical field limit of the magnetic devices. For instance, magnetic fields from the environment may flow through the magnetic shielding and alter data bits in an MRAM. Examples of an MRAM may include a STT-MRAMs that use a perpendicularly-oriented MTJ devices as the magnetic data bits and other device structures. A magnetic memory device (e.g., MRAM bit cell and/or MTJ element) may be configured to use spin-dependent diffusion, spin-orbit coupling, and spin transfer to write to a free structure (FL/FL) structure and/or may be configured to use an MTJ element (with tunneling magneto resistive (TMR) sensing, or alternatively, giant magneto-resistive (GMR) sensing or anisotropic magneto-resistive (AMR) sensing) structure for read-back.

Magnetic shielding examples are described for use with perpendicular magnetic devices. Magnetic shielding configurations with geometries and materials that can be used for magnetically shielding perpendicular magnetic devices. Applying magnetic shielding configurations for only in-plane magnetic devices may not be satisfactory for operating MRAMs. Applying appropriate magnetic shielding (e.g., magnetic shielding for perpendicularly-oriented magnetic structures) can enable using perpendicular magnetic devices to achieve higher memory density, lower power, and lower cost per bit with radiation hardness.

In accordance with one or more techniques described herein, magnetic shielding may be configured to shunt both in-plane and out-of-plane magnetization fields from an environment. For example, techniques may apply magnetic shielding to protect magnetic device(s) with perpendicular magnetization for the MRAM die and parts/products. Technology nodes may include, for example, various node sizes and/or types.

For example, an apparatus (e.g, package or a chip) may include first magnetic shielding on a first side (e.g., a left or right side) of a magnetic device and a second magnetic shielding on a second side (e.g., a top or bottom side). Applying magnetic shielding (e.g., magnetic shielding for perpendicularly-oriented magnetic structures) can enable the magnetic device to determine a perpendicular magnetization with minimal or no interference from both in-plane and out-of-plane magnetization fields from an environment, which may help to achieve a higher memory density, lower power, and/or lower cost per bit compared to devices that only shield for in-plane magnetization fields from the environment.

FIG. 1A shows a conceptual illustration of a first example of magnetic shielding of a magnetic device 120 in a two-dimensional x-z plane view, in accordance with the techniques of the disclosure. In the example of FIG. 1A, an apparatus 100 may include magnetic shielding 110, magnetic shielding 112, and a magnetic device 120.

Magnetic device 120 may be configured to determine a perpendicular magnetization 122 that extends along a z-axis 152. In some examples, magnetic device 120 may include a magnetic tunnel junction (MTJ) element. The MTJ element may include a free structure configured to store the perpendicular magnetization 122, a pinned structure, and a tunnel barrier arranged between the free structure and the pinned structure. Magnetic device 120 may be further configured to determine a parallel magnetization that extends along x-axis 150. In some examples, magnetic device 120 may include one or more MRAMs. For example, magnetic device 120 may include one or more STT-MRAMs.

Magnetic shielding 110, which may be referred to herein as a "first magnetic shielding," may include a magnetic material. Examples of a magnetic materials and alloys may include, one or more of nickel iron, nickel iron molybdenum, nickel iron with chromium, or other materials with additional material constituents. As shown in FIG. 1A, magnetic shielding 110 (e.g., first magnetic material of magnetic shielding 110) may extend at least partially between a first surface 170 of magnetic device 120 and a second surface 172 of magnetic device 120 in z-axis 152. For example, magnetic shielding 110 (e.g., first magnetic material of magnetic shielding 110) may extend at least a distance 171 extending between a first surface 170 of magnetic device 120 and a second surface 172 of magnetic device 120 in z-axis 152. As shown, first surface 170 may be on an opposite side of magnetic device 120 from second surface 172 of magnetic device 120. In this way, magnetic shielding 110 may shunt magnetic fields propagating in z-axis 152.

Magnetic shielding 110 be spaced apart from a third surface 174 of magnetic device 120 along x-axis 152. For example, magnetic shielding 110 may be spaced apart from magnetic device 120 by a non-zero distance (e.g., not abutting). In some examples, magnetic shielding 110 may be abutting magnetic shielding 112. As shown, x-axis 152 may be perpendicular to z-axis 150. In the example of FIG. 1A, magnetic material of magnetic shielding 110 may extend along z-axis 152 more than along x-axis 150. However, in some examples, the magnetic material of magnetic shielding 110 may extend along z-axis 152 less than along x-axis 150. In the example of FIG. 1A, magnetic shielding 112 may be opposite from third surface 174 of magnetic device 120 along x-axis 150. In some examples, however, magnetic shielding 110 be opposite from fourth surface 176 of magnetic device 120 along x-axis 150. Magnetic shielding 110 may be coupled to an electrical ground, also referred to herein as simply "ground," of magnetic device 120.

Magnetic shielding 112, which may be referred to herein as a "second magnetic shielding," may include a magnetic material. As shown in FIG. 1A, magnetic shielding 112 (e.g., second magnetic material of magnetic shielding 112) may extend at least partially between a third surface 174 of magnetic device 120 and a fourth surface 176 of magnetic device 120 in x-axis 150. Second magnetic shielding 112 (e.g., second magnetic material of magnetic shielding 112) may extend at least a second distance extending between third surface 174 of magnetic device 120 and fourth surface 176 of magnetic device 120 in x-axis 150. As shown, third surface 174 may be on an opposite side of magnetic device 120 from fourth surface 176 of magnetic device 120. In some examples, magnetic shielding 112 may be spaced apart magnetic device 120 along z-axis 152. In the example of FIG. 1A, magnetic shielding 112 may be opposite from first surface 170 of magnetic device 120 along z-axis 152. In some examples, however, magnetic shielding 112 be opposite from second surface 172 of magnetic device 120 along z-axis 152. Magnetic shielding 112 may be coupled to an electrical ground, also referred to herein as simply "ground," of magnetic device 120.

In accordance with one or more techniques described herein, magnetic shielding 110, 112 may be configured to shunt both in-plane and out-of-plane magnetization fields from an environment. For example, magnetic shielding 110 may help to shunt a magnetic field 130 that is out-of-plane. Similarly, magnetic shielding 112 may help to shunt a magnetic field that is in-plane. Applying magnetic shielding (e.g., magnetic shielding for perpendicularly-oriented magnetic structures) can enable magnetic device 120 to determine a perpendicular magnetization 122 with minimal or no interference from both in-plane and out-of-plane magnetization fields from an environment, which may help to achieve a higher memory density, lower power, and/or lower cost per bit compared to devices that only shield for in-plane magnetization fields from the environment.

FIG. 1B shows a conceptual illustration of the magnetic shielding of magnetic device 120 of FIG. 1A in a two-dimensional x-y plane view, in accordance with the techniques of the disclosure. Dimensions and ratios illustrated in FIG. 1B are for example purposes only. As shown, magnetic device 120 may be below magnetic shielding 112, as indicated by the dashed lines.

Figure 1C:
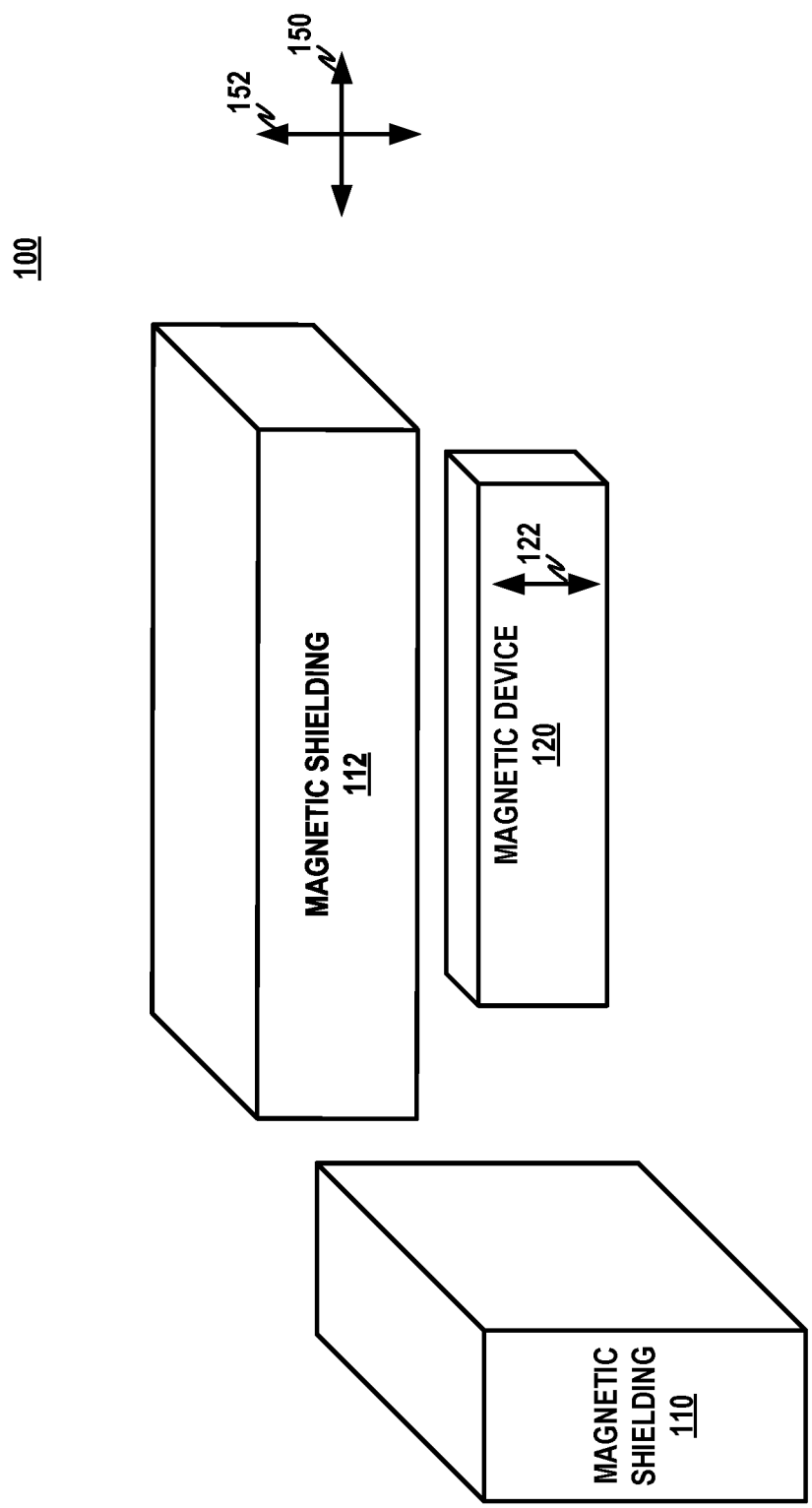
FIG. 1C shows a conceptual illustration of the magnetic shielding of FIG. 1A in a three-dimensional view, in accordance with the techniques of the disclosure.

FIG. 1C shows a conceptual illustration of the magnetic shielding of FIG. 1A in a three-dimensional view, in accordance with the techniques of the disclosure. Dimensions and ratios illustrated in FIG. 1C are for example purposes only.

Figure 2:
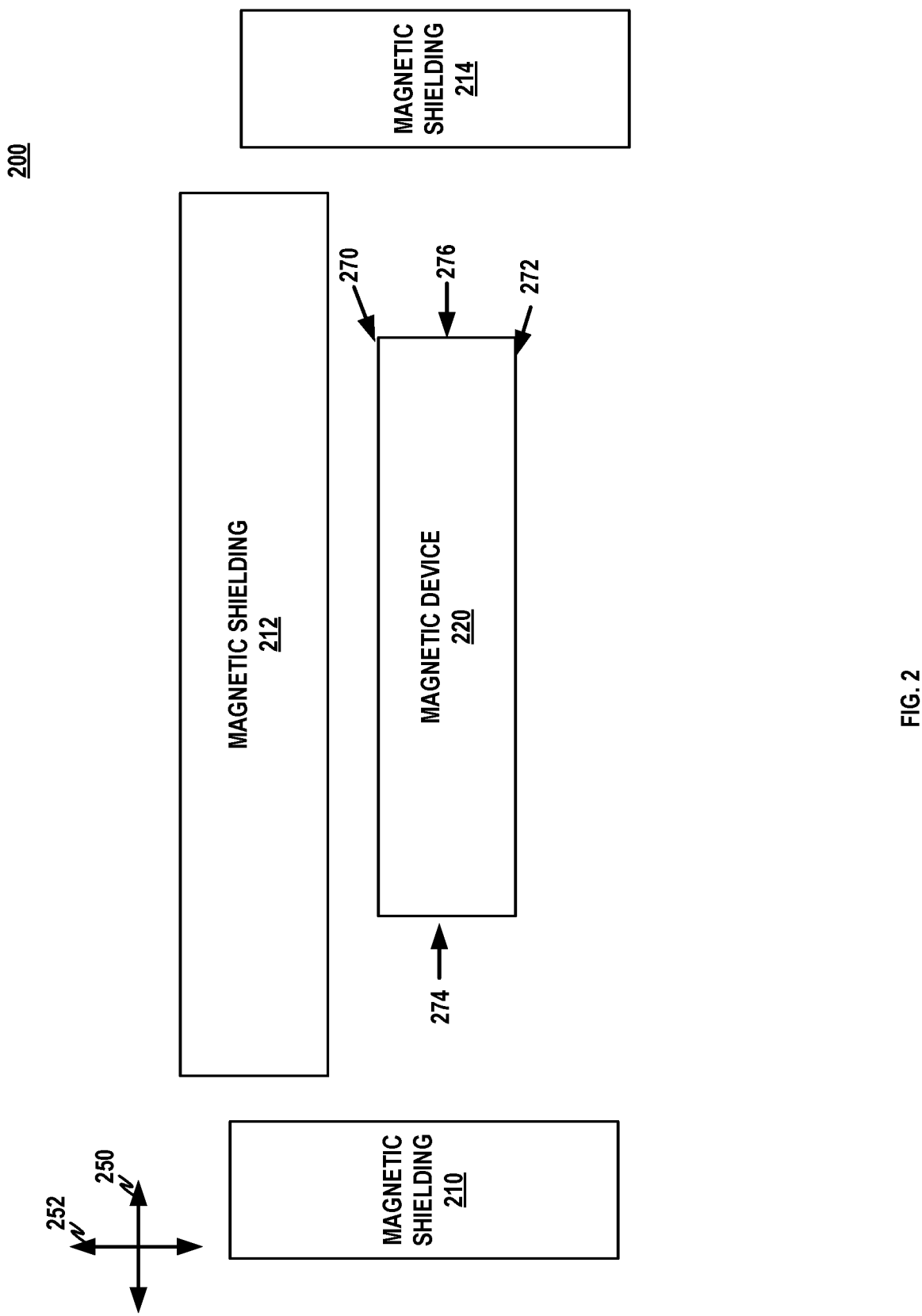
FIG. 2 shows a conceptual illustration of a second example of a magnetic shielding of a magnetic device in a two-dimensional x-z plane view, in accordance with the techniques of the disclosure.

FIG. 2 shows a conceptual illustration of a second example of a magnetic shielding of a magnetic device 220 in a two-dimensional x-z plane view, in accordance with the techniques of the disclosure. In the example of FIG. 2, an apparatus 200 may include magnetic shielding 210, magnetic shielding 212, and a magnetic device 220, which may be examples of magnetic shielding 110, magnetic shielding 112, and magnetic device 120 of FIGS. 1A-1C, respectively. In the example of FIG. 2, apparatus 200 further includes magnetic shielding 214.

Magnetic shielding 214, which may be referred to herein as a "third magnetic shielding," may include a magnetic material. As shown in FIG. 2, magnetic shielding 214 (e.g., third magnetic material of magnetic shielding 214) may extend at least partially between a first surface 270 of magnetic device 220 and a second surface 272 of magnetic device 220 in z-axis 252. Magnetic shielding 214 may be spaced apart from fourth surface 276 of magnetic device 220 along x-axis 250. In some examples, magnetic shielding 214 may be opposite from fourth surface 276 of magnetic device 220. As shown, x-axis 252 may be perpendicular to z-axis 250. Magnetic shielding 214 may further reduce or help to eliminate stray magnetic fields in the environment from impacting (e.g., changing) magnetization (e.g., in-plane magnetization) of magnetic device 220.

Figure 3:
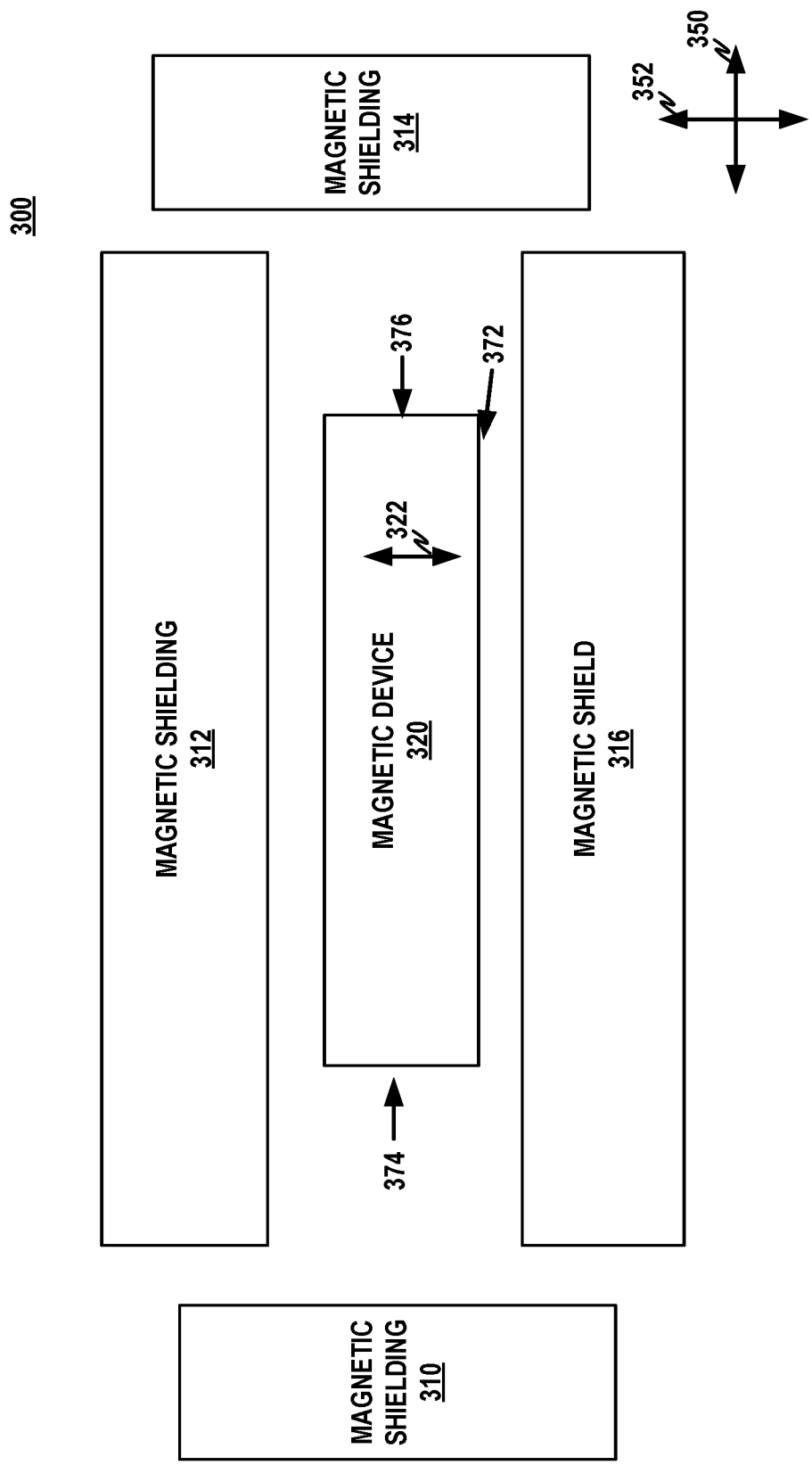
FIG. 3 shows a conceptual illustration of a third example of a magnetic shielding of a magnetic device in a two-dimensional x-z plane view, in accordance with the techniques of the disclosure.

FIG. 3 shows a conceptual illustration of a third example of a magnetic shielding of a magnetic device 320 in a two-dimensional x-z plane view, in accordance with the techniques of the disclosure. In the example of FIG. 3, an apparatus 300 may include magnetic shielding 310, magnetic shielding 312, magnetic shielding 314, and a magnetic device 320, which may be examples of magnetic shielding 210, magnetic shielding 212, magnetic shielding 214, and magnetic device 220 of FIG. 2, respectively. In the example of FIG. 3, apparatus 300 further includes magnetic shielding 316.

Magnetic shielding 316, which may be referred to herein as a "fourth magnetic shielding," may include a magnetic material. As shown in FIG. 3, magnetic shielding 316 (e.g., fourth magnetic material of magnetic shielding 316) may extend at least partially between third surface 374 of magnetic device 320 and fourth surface 376 of magnetic device 320 in x-axis 350. Magnetic shielding 316 may be placed opposite from second surface 372 of magnetic device 320. As shown, x-axis 352 may be perpendicular to z-axis 350. Magnetic shielding 316 may further reduce or help to eliminate stray magnetic fields in the environment from impacting (e.g., changing) perpendicular magnetization 322 of magnetic device 320.

Figure 4:
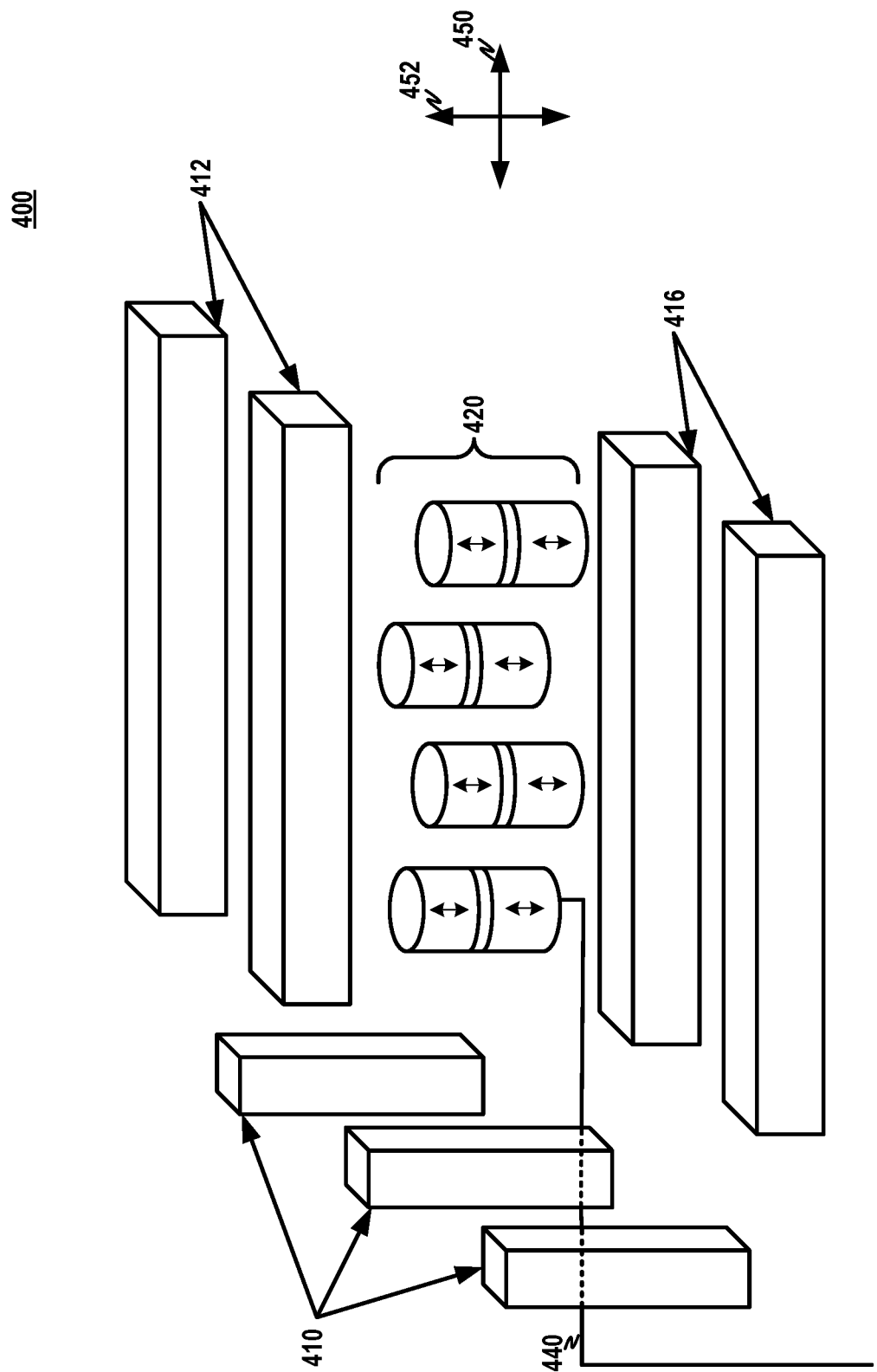
FIG. 4 shows a conceptual illustration of a fourth example of a magnetic shielding of a magnetic device in a three-dimensional view, in accordance with the techniques of the disclosure.

FIG. 4 shows a conceptual illustration of a fourth example of a magnetic shielding of a magnetic device 420 in a three-dimensional view, in accordance with the techniques of the disclosure. In the example of FIG. 4, an apparatus 400 may include magnetic shielding 410, magnetic shielding 412, magnetic shielding 416, and a magnetic device 420. Magnetic shielding 410, magnetic shielding 412, magnetic shielding 414 may include a first plurality of patterned structures formed of magnetic material. Examples of patterned structures may include columnar, rectangular, curved, elliptical, cylindrical, stacked, concentric, offset, irregular, or other shapes. A patterned structure may comprise a piece or set of pieces of material that has its shape made and contoured to conform with a given geometry for an application. For example, magnetic shielding 410 may comprises a plurality of columnar structures formed of magnetic material. The use of patterned structures, such as columnar structures, may help to allow pin 540 to electrically couple to magnetic device 420. As shown, pin 440 may extend from magnetic device 420 along x-axis 450 and completely through first magnetic shielding 410.

Figure 5:
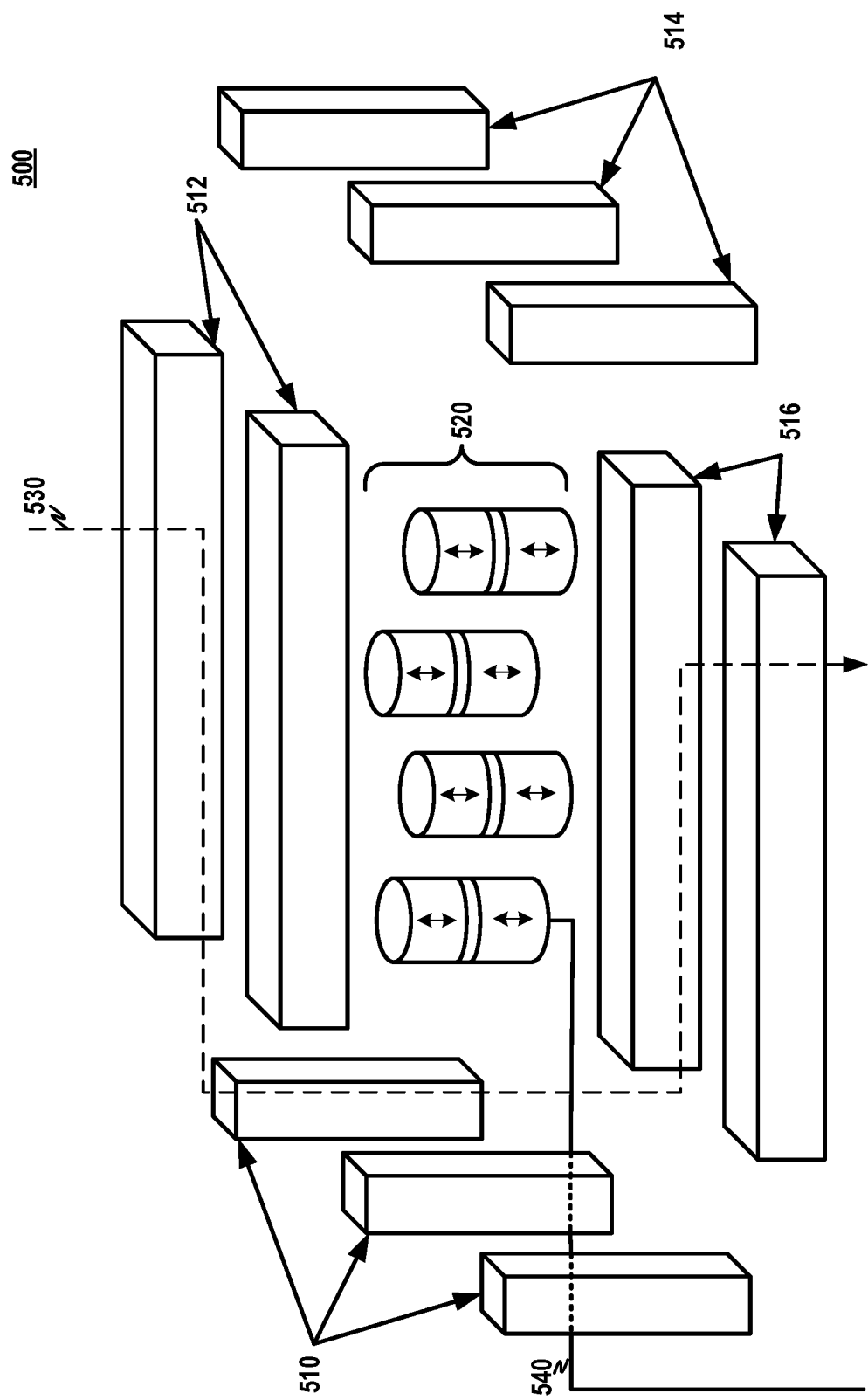
FIG. 5 shows a conceptual illustration of a fifth example of a magnetic shielding of a magnetic device in a three-dimensional view, in accordance with the techniques of the disclosure.

FIG. 5 shows a conceptual illustration of a fifth example of a magnetic shielding of a magnetic device 520 in a three-dimensional view, in accordance with the techniques of the disclosure. In the example of FIG. 5, an apparatus 500 may include magnetic shielding 510, magnetic shielding 512, magnetic shielding 514, and a magnetic device 520. Apparatus 500 may further include magnetic shielding 514.

Figure 6:
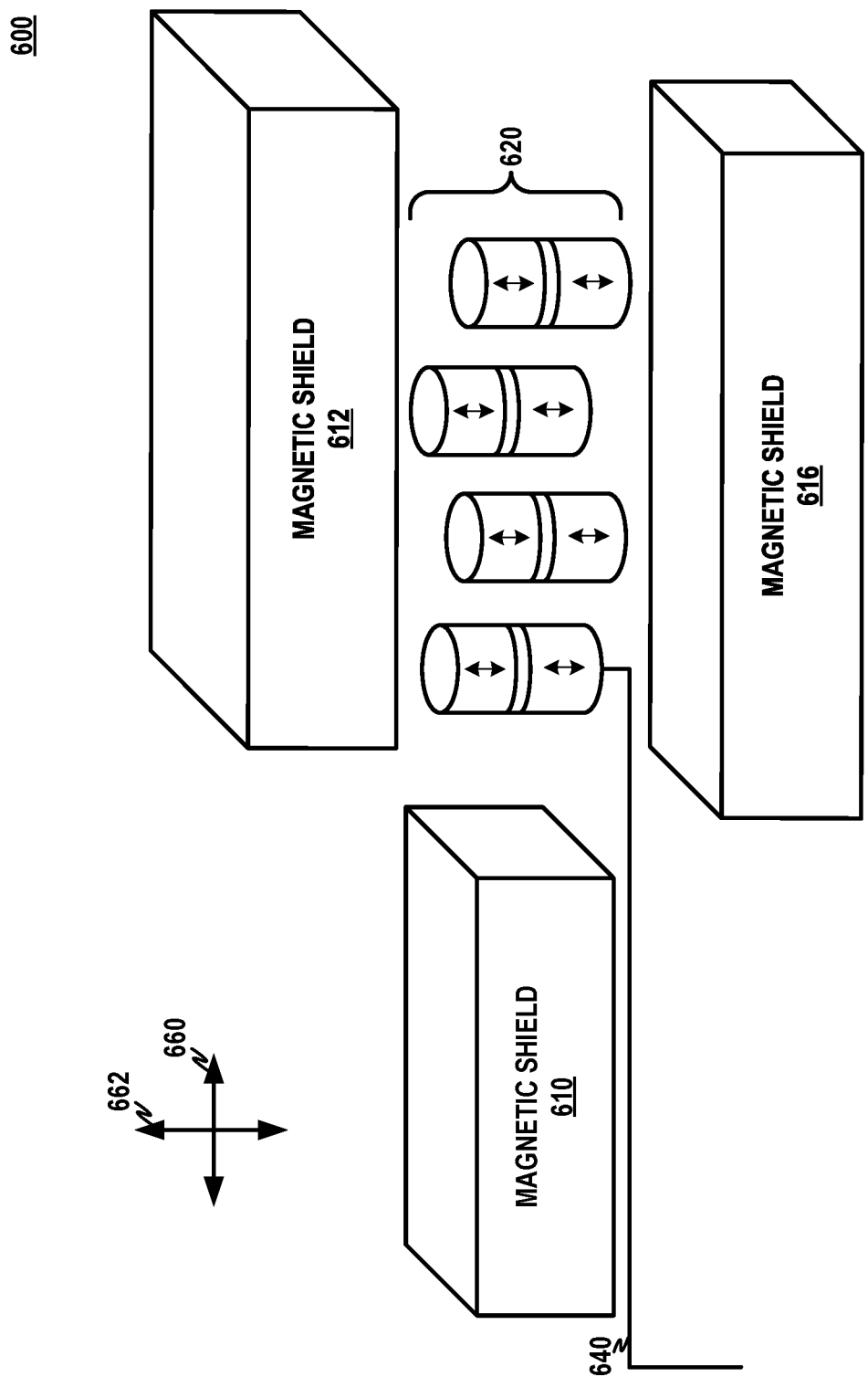
FIG. 6 shows a conceptual illustration of a sixth example of a magnetic shielding of a magnetic device in a three-dimensional view, in accordance with the techniques of the disclosure.

FIG. 6 shows a conceptual illustration of a sixth example of a magnetic shielding of a magnetic device 620 in a three-dimensional view, in accordance with the techniques of the disclosure. In the example of FIG. 6, an apparatus 600 may include magnetic shielding 610, magnetic shielding 612, magnetic shielding 616, and a magnetic device 620. Magnetic shielding 610 may extend along x-axis 660 more than along z-axis 662. Magnetic shielding 610 may help to allow pin 640 to electrically couple to magnetic device 620. As shown, pin 640 may extend from magnetic device 620 along x-axis 650 and completely through first magnetic shielding 610.

Figure 7:
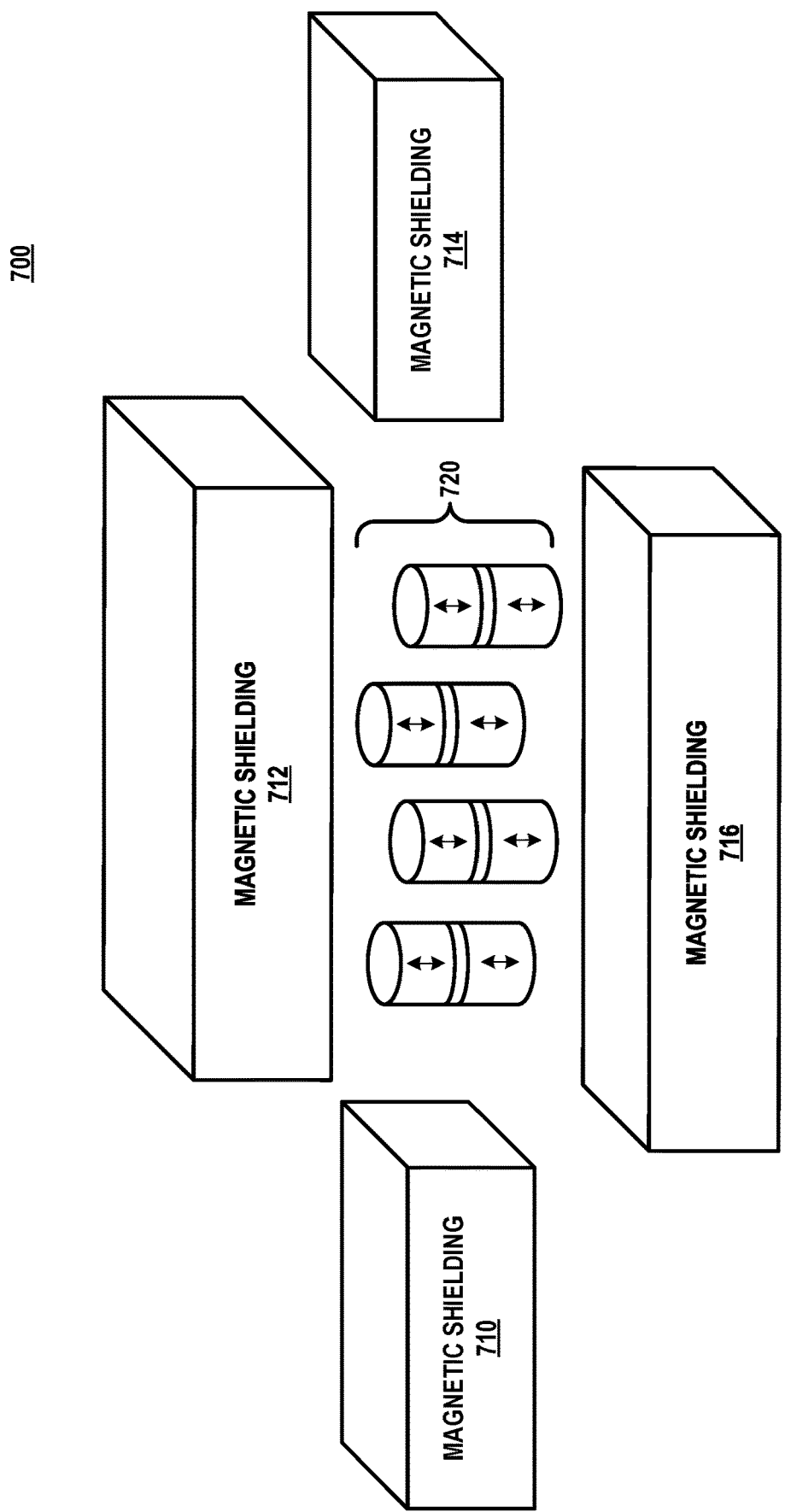
FIG. 7 shows a conceptual illustration of a seventh example of a magnetic shielding of a magnetic device in a three-dimensional view, in accordance with the techniques of the disclosure.

FIG. 7 shows a conceptual illustration of a seventh example of a magnetic shielding of a magnetic device 720 in a three-dimensional view, in accordance with the techniques of the disclosure. In the example of FIG. 7, an apparatus 700 may include magnetic shielding 710, magnetic shielding 712, magnetic shielding 714, and a magnetic device 720. Apparatus 700 may further include magnetic shielding 714.

Figure 8:
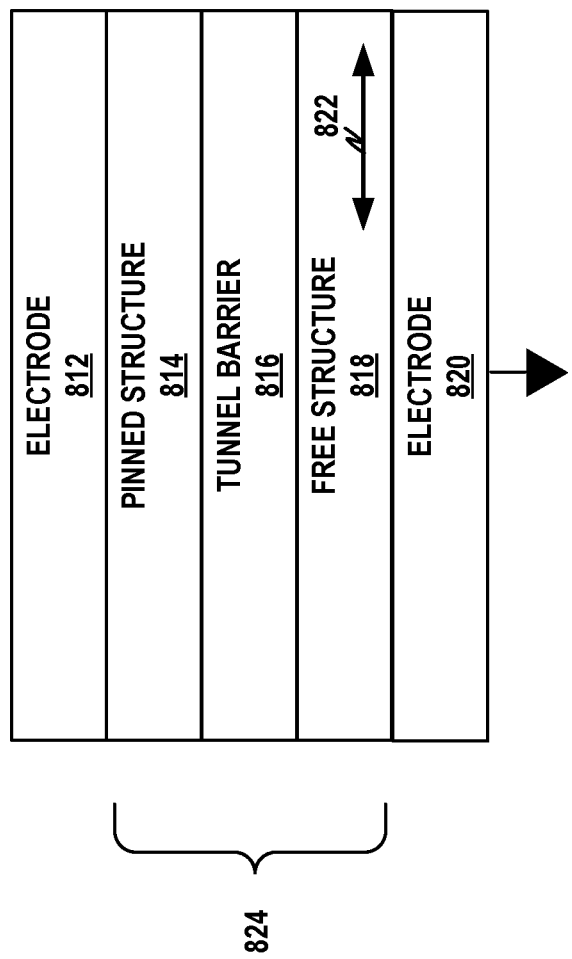
FIG. 8 shows a conceptual illustration of an example of a magnetic tunnel junction (MTJ) element, in accordance with the techniques of the disclosure.

FIG. 8 shows a conceptual illustration of an example of a MTJ element 824, in accordance with the techniques of the disclosure. MTJ element 824 includes free structure 804, tunnel barrier 808, and a pinned structure 810. Free structure 804 may include multiple free layers. Free structure 804 may include a magnetization direction that is free to switch between a parallel orientation and an antiparallel orientation. Tunnel barrier 808 includes a non-magnetic metal that separates free structure 804 and pinned structure 710. In some examples, tunnel barrier 808 may be formed of aluminum oxide, magnesium oxide, or another material. Pinned structure 810 may include a magnetization direction that is fixed or "pinned" to a single orientation. For example, pinned structure 810 may be pinned in a parallel orientation. In other examples, pinned structure 810 may be pinned in an antiparallel orientation. In the example of FIG. 8, pinned structure 810 may include an anti-ferromagnetic layer, such that the magnetization direction of the pinned structure 810 is "pinned" in a particular orientation the magnetization direction of the pinned structure 810 remains relatively fixed when operational magnetic fields are applied to MTJ element 824.

Electrodes 812, 820 may be formed of a conductive material to permit a connection to MTJ element 824. Examples of conductive materials may include, but are not limited to, copper. As shown, in this example, tunnel barrier 808 may be arranged below free structure 804. A geometry of tunnel barrier 808 may be optimized for read endurance without being subject to the write process.

Figure 9:
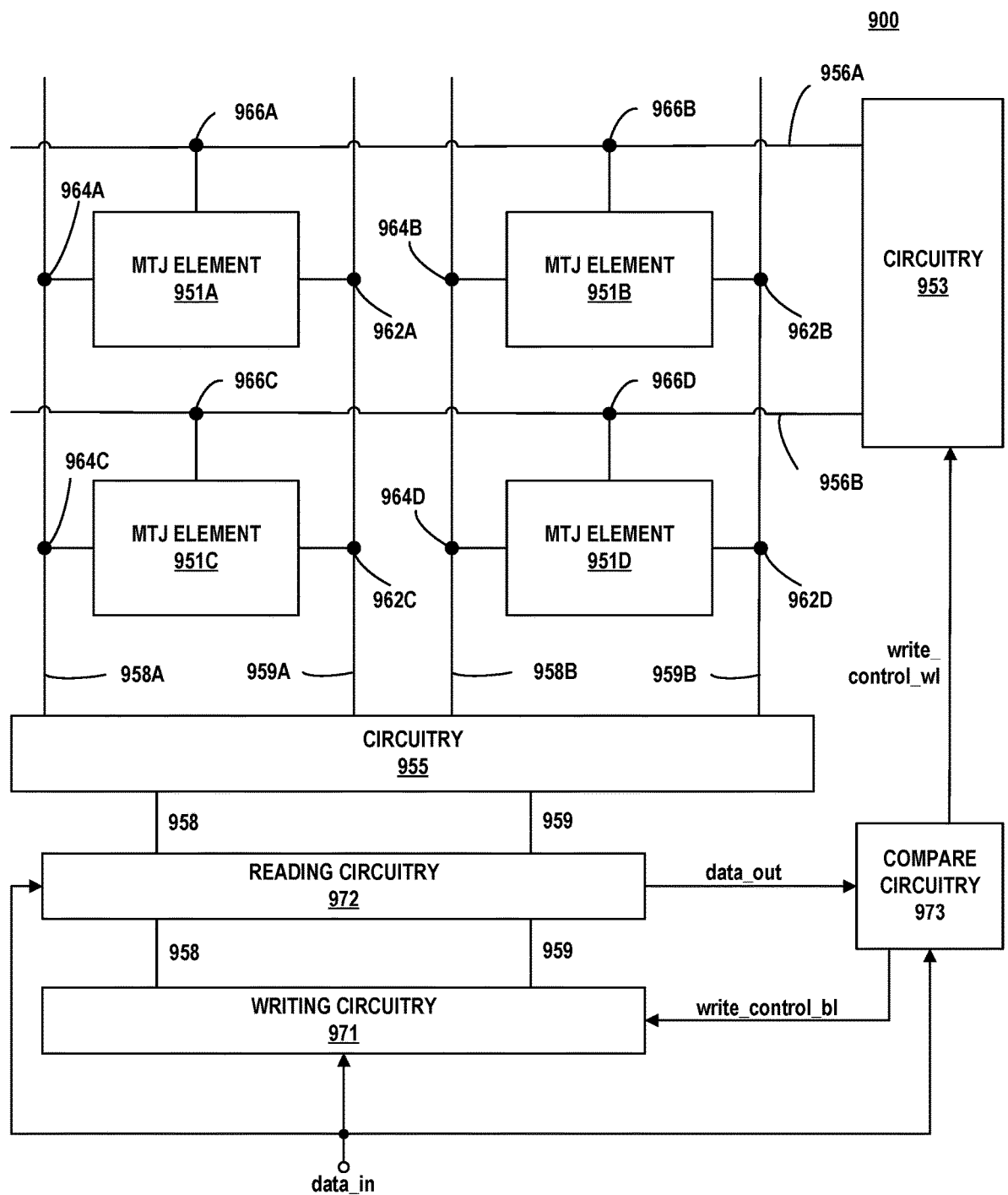
FIG. 9 shows a diagram of a magnetic device that may be used to implement the techniques of the present disclosure, in accordance with the techniques of the disclosure.

FIG. 9 shows a diagram of a magnetic device 900 that may be used to implement the techniques of the present disclosure. Memory devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions. Processing circuitry may include circuitry 955, reading circuitry 972, writing circuitry 971, compare circuitry 973, and circuitry 953. While the following example refers to an example using MTJ elements, techniques described herein may apply to any magnetic device. For example, techniques described herein may be applied to MRAM, such as, for example, STT-MRAMs.

Bitline 958A connects to MTJ element 951A ("MTJ element") at node 964A and connects to MTJ element 951C at node 964C. Bitline 958B connects to MTJ element 951B at node 964B and connects to MTJ element 951D at node 964D. Although, not explicitly shown in FIG. 9, each of nodes 964A-964D may correspond to a source or drain terminal of an access MOSFET for a respective MTJ element.

Bitline 959A connects to MTJ element 951A at node 962A and connects to MTJ element 951C at node 962C. Bitline 959B connects to MTJ element 951B at node 962B and connects to MTJ element 951D at node 962D. Although, not explicitly shown in FIG. 9, each of nodes 962A-962D may correspond to a source or drain terminal of an access MOSFET of a respective MTJ element. For example, node 964A may correspond to a source or drain terminal of an access MOSFET for MTJ element 951A and node 962A may correspond to a source or drain terminal of an access MOSFET for MTJ element 951A.

By controlling the voltages applied to wordline 956A, wordline 956B, bitline 958A, bitline 958B, bitline 959A, and bitline 959B, an individual MTJ element can be addressed. For example, suppose that a write operation is being performed on MTJ element 951A. Circuitry 953 may apply an access MOSFET turn-on voltage to wordline 956A and a turn-off voltage to wordline 956B, and circuitry 955 may pass a high voltage to bitline 959A but not to bitline 959B. In this case, the turn-on voltage applied to wordline 956A causes node 966A (connected to a gate of an access MOSFET, not shown in FIG. 9) to receive a turn-on voltage. The high voltage applied to bitline 959A causes node 962A (connected to a source or drain of an access MOSFET, not shown in FIG. 9) to receive a high voltage, and a source voltage applied to bitline 958A causes node 964A (connected to a source or drain of an access MOSFET) to receive a source voltage. As described above, the high voltage applied to node 966A causes current to flow through an access MOSFET, resulting in current through MTJ element 951A. Thus, the resistance and/or magnetoresistance of MTJ element 951A can be changed. Examples of resistance and/or magnetoresistance may include, but are not limited to, tunnel magnetoresistance (TMR), giant magnetoresistance (GMR), anisotropic magnetoresistive (ARM), and other resistance and/or magnetoresistance.

While this write operation is occurring at MTJ element 951A, it is intended that MTJ elements 951B, 951C, and 951D remain unchanged. Although the high voltage applied to wordline 956A can cause a high voltage at node 966B (connected to a gate of an access MOSFET for MTJ element 951B), circuitry 955 may not apply a high voltage to either bitline 958B or bitline 959B. In this case, with no high voltage drop across an access MOSFET for MTJ element 951B, the state of MTJ element 951B does not change.

Similarly, while this write operation is occurring at MTJ element 951A, the high voltage applied to bitline 959A causes a high voltage at node 962C, and the source voltage applied to bitline 958A causes a source voltage at node 964C. Circuitry 953, however, applies a turn-off voltage to wordline 956B. Thus, the access MOSFET of MTJ element 951C does not conduct current, and thus it is intended that this prevents current at MTJ element 951C. Without a current flow, the resistance of MTJ element 951C does not change, and the state of MTJ element 951C does not change. Accordingly, by controlling the voltages applied to wordline 956A, wordline 956B, bitline 958A, bitline 958B, bitline 959A, and bitline 959B, in the manner described above, MTJ elements 951A, 951B, 951C, and 951D can be individually written to without altering the state of MTJ elements that are connected to a common wordline or common bitline.

Writing circuitry 971 receives data input (e.g., '0' or '1'), which represents a state of two states. Depending on the data state to be written, writing circuitry 971 defines the appropriate voltage to be applied to the bitlines. As discussed above, circuitry 955 controls the passing of the voltages from writing circuitry 971 output bitline 958 and bitline 959 to the various bitlines so that the write operation is applied to the correct MTJ element within the array of MTJ elements.

Reading circuitry 972 is configured to monitor the resistance and/or magnetoresistance of a given MTJ element, which may correspond to a spin-dependent diffusion, spin-orbit coupling, and spin transfer of the given MTJ element, while the given MTJ element is undergoing a write operation. This monitoring of the resistance and/or magnetoresistance is termed Rmonitor, which represents the real time measuring of the MTJ element resistance and/or magnetoresistance during the write operation. Reading circuitry 972 uses the write "0" or "1" states defined on data_in to determine which monitoring state and Rwrite_ref to set up.

Compare circuitry 973 compares the "0" or "1" data state of the selected MTJ element of MTJ elements 951A-951D, as determined by reading circuitry 972 and defined on node data_out, to the "0" or "1" data state as defined on node data_in and issues a write terminate instruction on the write_control_bl and write_control_wl lines upon determining that the data states on data_in and data_out match.

When circuitry 973 issues a write terminate command on write_control_bl to writing circuitry 971, writing circuitry 971 terminates the application of the high voltage on bitline 958 or bitline 959 which causes the high voltage across the selected MTJ element to collapse and, thus, stop the resistance and/or magnetoresistance changing and stop modifying spin-dependent diffusion, spin-orbit coupling, and spin transfer of the MTJ element. When circuitry 973 issues a write terminate command on write_control_wl to circuitry 953, circuitry 953 changes the turned-on wordline to turned-off which causes the selected MTJ element to collapse and, thus, stop the resistance and/or magnetoresistance changing in the MTJ element.

In accordance with one or more techniques described herein, writing circuitry 971 is configured to receive an instruction to set an MTJ element to a target state of a plurality of states. For example, writing circuitry 971 may be configured to receive an instruction to set MTJ element 951A to a state '1'. In response to receiving the instruction, writing circuitry 971 may be configured to generate electrical current to modify a resistance of the MTJ element to correspond to the target state. For example, writing circuitry 971 may be configured to define the appropriate voltage to be applied to the bitlines. In this example, circuitry 955 controls the passing of voltages from writing circuitry 971 output bitline 958 and bitline 959 to the various bitlines such that the write operation is applied to the correct MTJ element within the array of MTJ elements. For instance, writing circuitry 971 generates electrical current through MTJ element 951 to set MTJ element 951 to a state '1'.

Figure 10:
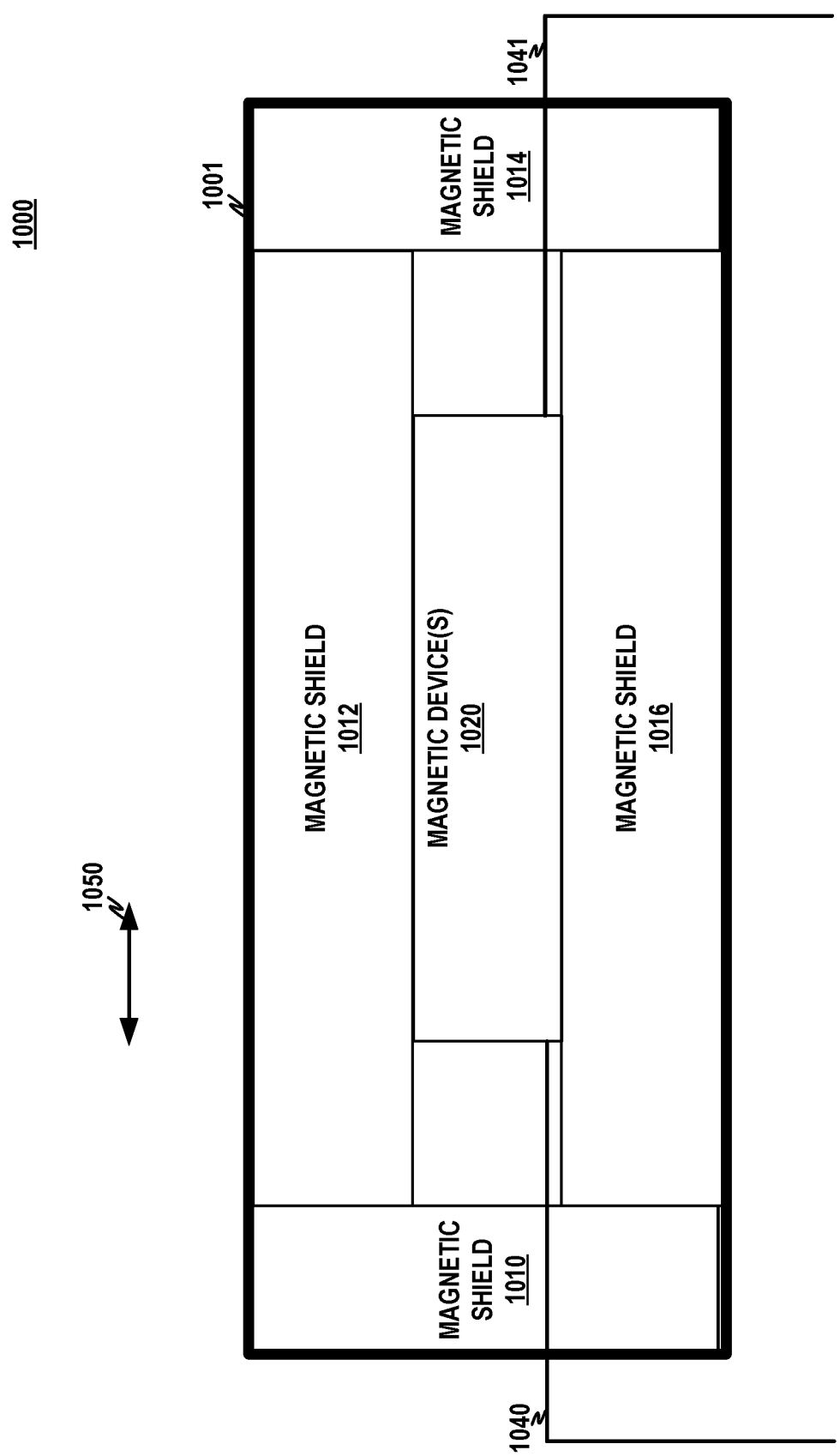
FIG. 10 shows a conceptual illustration of an example of a chip package, in accordance with the techniques of the disclosure.

FIG. 10 shows a conceptual illustration of an example of a chip package 1000, in accordance with the techniques of the disclosure. As shown, chip package 1000 may include magnetic shields 1010-1016. However, in some examples, one or more magnetic shields of magnetic shields 1010-1016 may be omitted. Any combination of magnetic shields 1010-1016 may be coupled to an electrical ground, also referred to herein as simply "ground," of magnetic device 1020.

Chip package 1000 may include an integrated circuit formed in a die 1001. Chip package 1000 may comprise semiconductor chips. For example, magnetic device(s) 1020, also referred to herein as simply "magnetic device 1020," may be formed using a chip package comprising a single chip. In some examples, magnetic device 1020 may be formed using a chip package comprising multi-chip module. As shown, one or more of magnetic shields 1010-1016 may be formed in the die 1001. In some examples, one or more of magnetic shields 1010-1016 may be formed in chip package 1000. One or more of magnetic shields 1010-1016 may be formed externally from chip package 1000.

In this example, chip package 1000 may comprise one or more pins 1040-1041. For example, pin 1040 may be electrically coupled to magnetic device 1020 and extending from magnetic device 1020 along the x-axis 1050 and completely through magnetic shielding 1010. In some examples, pin 1041 may be electrically coupled to magnetic device 1020 and extending from magnetic device 1020 along the x-axis 1050 and completely through magnetic shielding 1014. In this way, pins for magnetic device 1020 may extend through "sides" of chip package. For instance, magnetic shield 1010 may comprise a plurality of patterned structures (e.g., columnar structures) formed of magnetic material and pin 1040 may extend between a first structure of the plurality of patterned structures and a second structure of the plurality of patterned structures. Similarly, magnetic shield 1014 may comprise a plurality of patterned structures (e.g., columnar structures) formed of magnetic material and pin 1040 may extend between a first structure of the plurality of patterned structures and a second structure of the plurality of patterned structures.

Figure 11:
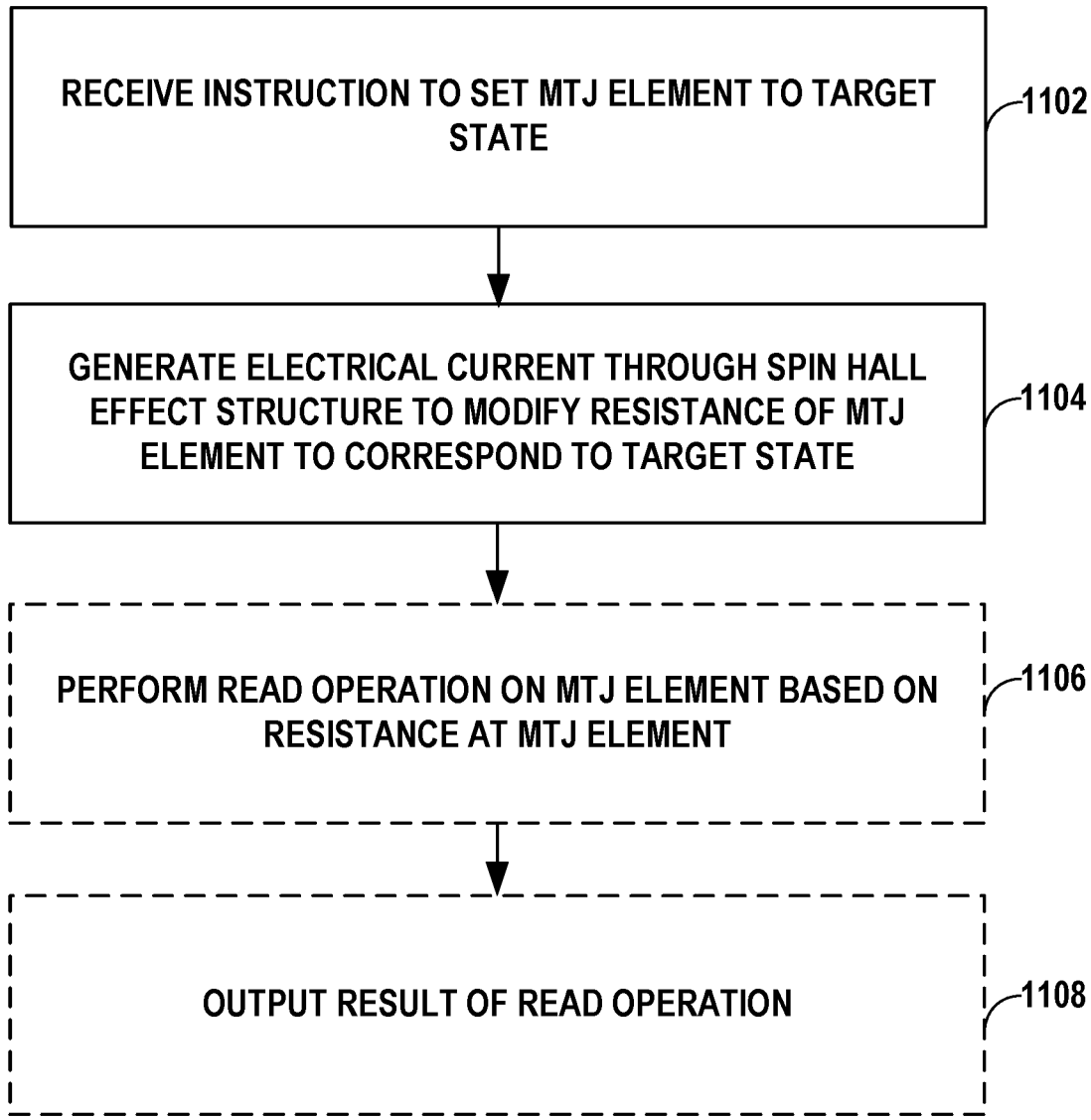
FIG. 11 shows a flowchart of a process for performing a write operation, in accordance with the techniques of this disclosure.

FIG. 11 shows a flowchart of a process for performing a write operation, in accordance with the techniques of this disclosure. The techniques of FIG. 11 may, for example, be performed by magnetic device described above with respect to any combination of FIGS. 1-10. While the following example refers to an example using MTJ elements, techniques described herein may apply to any magnetic device. For example, techniques described herein may be applied to MRAM, such as, for example, STT-MRAMs.

Processing circuitry receives an instruction to set a MTJ element of a magnetic device to a target state of a plurality of states (1002). For example, processing circuitry 116 receives an instruction to set a MTJ element to a high logical value "1." The processing circuitry may generate electrical current to modify a resistance of the MTJ element to correspond to the target state (1004). For example, the processing circuitry may generate electrical current to modify a spin-dependent diffusion, spin-orbit coupling, and spin transfer of MTJ element 124 to a resistance that corresponds to the high logical value "1."

The processing circuitry may optionally perform a read operation on MTJ element based on a resistance at MTJ element (1006). For example, the processing circuitry may determines the MTJ element has a state of the high logical value "1" when a resistance of the MTJ element corresponds to the high logical value "1." The processing circuitry may optionally output an indication of the read operation (1008). For example, the processing circuitry may output a high logical value "1" in response to the read operation on the MTJ element.

The processing circuitry may include metallization and/or integrated circuitry (e.g., Complementary metal-oxide-semiconductor (CMOS)). The processing circuitry may include an analog circuit. In some examples, the processing circuitry may include a microcontroller on a single integrated circuit containing a processor core, memory, inputs, and outputs. For example, the processing circuitry may include one or more processors, including one or more microprocessors, Digital Signal Processors (DSPs), ASICS, Field Programmable Gate Arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry may include a combination of one or more analog components and one or more digital components.

The term "circuitry" as used herein may refer to any of the foregoing structure or any other structure suitable for processing program code and/or data or otherwise implementing the techniques described herein. Circuitry may, for example, include any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. An apparatus comprising:
    a magnetic device extending at least along an x-axis, a y-axis, and a z-axis, wherein the magnetic device is configured to determine a perpendicular magnetization that extends along the z-axis and further configured to determine a parallel magnetization that extends along the x-axis, wherein the x-axis is perpendicular to the z-axis, the x-axis is perpendicular to the y-axis, and the z-axis is perpendicular to the y-axis;
    first magnetic shielding comprising a first magnetic material, the first magnetic shielding extending at least a first distance along the z-axis and extending at least a second distance along the y-axis, wherein:
        the first distance is a distance between a first outer surface of the magnetic device and a second outer surface of the magnetic device in the z-axis,
        the second distance is a distance between a front of the magnetic device and a back of the magnetic device in the y-axis, the first outer surface is on an opposite side of the magnetic device from the second outer surface of the magnetic device and wherein the front of the magnetic device is on an opposite side of the magnetic device from the back of the magnetic device; and
second magnetic shielding comprising a second magnetic material, the second magnetic shielding extending at least a third distance along the x-axis, wherein;
the third distance is a distance between a third outer surface of the magnetic device and a fourth outer surface of the magnetic device in the x-axis,
the fourth outer surface is on an opposite side of the magnetic device from the third outer surface of the magnetic device.

2. The apparatus of claim 1, wherein the magnetic device comprises a magnetic tunnel junction (MTJ) element, the MTJ element comprising a free structure configured to store the perpendicular magnetization that extends along the z-axis, a pinned structure, and a tunnel barrier arranged between the free structure and the pinned structure.

3. The apparatus of claim 1, wherein the magnetic device comprises magneto-resistive random access memories (MRAMs).

4. The apparatus of claim 3, wherein the magnetic device comprises one or more of a spin-torque transfer MRAM (STT-MRAM) or a magnetic tunnel junction (MTJ) element.

5. The apparatus of claim 1, wherein the first magnetic shielding extends at least a first distance extending between the first outer surface of the magnetic device and the second outer surface of the magnetic device in the z-axis.

6. The apparatus of claim 1, wherein the second magnetic shielding extends at least a second distance extending between the third outer surface of the magnetic device and the fourth outer surface of the magnetic device in the x-axis.

7. The apparatus of claim 1, wherein the first magnetic shielding and the second magnetic shielding are not abutting.

8. The apparatus of claim 1, wherein the first magnetic shielding comprises a first plurality of patterned structures formed of the first magnetic material.

9. The apparatus of claim 8, wherein the first plurality of patterned structures comprises a plurality of columnar structures formed of the first magnetic material.

10. The apparatus of claim 1, wherein the first magnetic material extends along the z-axis more than along the x-axis.

11. The apparatus of claim 1, wherein the first magnetic material extends along the x-axis more than along the z-axis.

12. The apparatus of claim 1, further comprising third magnetic shielding comprising a third magnetic material, the third magnetic shielding extending between the first outer surface of the magnetic device and the second outer surface of the magnetic device in the z-axis, wherein the magnetic device separates the first magnetic shielding and second magnetic shielding along the x-axis.

13. The apparatus of claim 12, wherein the second magnetic shielding is placed opposite from the first outer surface of the magnetic device, the apparatus further comprising:
fourth magnetic shielding comprising a fourth magnetic material, the fourth magnetic shielding extending at least partially between the third outer surface of the magnetic device and the fourth outer surface of the magnetic device in the x-axis and being placed opposite from the second outer surface of the magnetic device.

14. The apparatus of claim 1, wherein the first magnetic shielding and the second magnetic shielding are coupled to a ground of the magnetic device.

15. The apparatus of claim 1, wherein apparatus forms a chip package comprising one or more semiconductor chips.

16. A chip package comprising:
a magnetic device extending at least along an x-axis, a y-axis, and a z-axis, wherein the magnetic device is configured to determine a perpendicular magnetization that extends along the z-axis;
first magnetic shielding comprising a first magnetic material, the first magnetic shielding extending at least a first distance along the z-axis and extending at least a second distance along the y-axis, wherein:
the first distance is a distance between a first outer surface of the magnetic device and a second outer surface of the magnetic device in the z-axis,
the second distance is a distance between a front of the magnetic device and a back of the magnetic device in the y-axis, and
the first outer surface is on an opposite side of the magnetic device from the second outer surface of the magnetic device and wherein the front of the magnetic device is on an opposite side of the magnetic device from the back of the magnetic device;
second magnetic shielding comprising a second magnetic material, the second magnetic shielding extending at least a third distance along the x-axis, wherein;
the third distance is a distance between a third outer surface of the magnetic device and a fourth outer surface of the magnetic device in the x-axis, and
the fourth outer surface is on an opposite side of the magnetic device from the third outer surface of the magnetic device, wherein the x-axis is perpendicular to the z-axis and wherein the x-axis is perpendicular to the y-axis; and
one or more pins, each pin of the one or more pins being electrically coupled to the magnetic device and extending from the magnetic device along the x-axis and completely through the first magnetic shielding.

17. The chip package of claim 16,
wherein the first magnetic shielding comprises a plurality of patterned structures formed of the first magnetic material; and
wherein a pin of the one or more pins extends between a first structure of the plurality of patterned structures formed of the first magnetic material and a second structure of the plurality of patterned structures formed of the first magnetic material.

18. An apparatus comprising:
magneto-resistive random access memories (MRAMs) extending at least along an x-axis, a y-axis, and a z-axis, each MRAM being configured to store data based on a perpendicular magnetization that extends along the z-axis and further configured to determine a parallel magnetization that extends along the x-axis, the x-axis is perpendicular to the y-axis, and the z-axis is perpendicular to the y-axis;
first magnetic shielding comprising a first magnetic material, the first magnetic shielding extending at least a first distance along the z-axis and extending at least a second distance along the y-axis, wherein;
the first distance is a distance between a first outer surface of the MRAMs and a second outer surface of the MRAMs in the z-axis,
the second distance is a distance between a front of the MRAMs and a back of the MRAMs in the y-axis,
the first outer surface is on an opposite side of the MRAMs from the second outer surface of the MRAMs and wherein the front of the MRAMs is on an opposite side of the MRAMs from the back of the MRAMs; and second magnetic shielding comprising a second magnetic material, the second magnetic shielding extending at least a third distance the x-axis, wherein:
  the third distance is a distance between a third outer surface of the MRAMs and a fourth outer surface of the MRAMs in the x-axis,
  the fourth outer surface is on an opposite side of the MRAMs from the third outer surface of the MRAMs.

\* \* \* \* \*